United States Patent
Hosoda et al.

(10) Patent No.: US 6,861,755 B2
(45) Date of Patent: Mar. 1, 2005

(54) SEMICONDUCTOR DEVICE

(75) Inventors: Tsutomu Hosoda, Kawasaki (JP); Akira Yamanoue, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/694,985

(22) Filed: Oct. 29, 2003

(65) Prior Publication Data

US 2004/0084778 A1 May 6, 2004

(30) Foreign Application Priority Data

Oct. 30, 2002 (JP) .......................................... 2002-315609

(51) Int. Cl.⁷ .................... H01L 23/48; H01L 23/52; H01L 29/40; H01L 23/58
(52) U.S. Cl. .................... 257/758; 257/750; 257/643
(58) Field of Search .................... 257/635–644, 257/750–765

(56) References Cited

U.S. PATENT DOCUMENTS 6,137,155 A * 10/2000 Seshan et al. .............. 257/640
6,605,874 B2 * 8/2003 Leu et al. .................... 257/758

FOREIGN PATENT DOCUMENTS

| JP | 2000-232081 | 8/2000 |
|----|-------------|--------|
| JP | 2000-232104 | 8/2000 |
| JP | 2000-232105 | 8/2000 |
| JP | 2000-277465 | 10/2000 |
| JP | 2000-277713 | 10/2000 |
| JP | 2001-053148 | 2/2001 |
| JP | 2001-168093 | 6/2001 |
| JP | 2002-134506 | 5/2002 |

* cited by examiner

Primary Examiner—Cuong Nguyen
(74) Attorney, Agent, or Firm—Westerman, Hattori, Daniels & Adrian, LLP

(57) ABSTRACT

The semiconductor device comprises an insulating film 114 formed mainly of a film of polyallyl ether resin; an interconnection structure 116 buried in the insulating film 114, and having a via portion buried in a groove-shaped via hole and an interconnection portion formed on the via portion and having an eave-shaped portion horizontally extended beyond the via portion; an insulating film 118 formed on the insulating film 114 with the interconnection structure 116 buried in and formed mainly of a film of organosilicate glass; and an interconnection structure 120 buried in the insulating film 118 and connected to the interconnection structure 116. Thus, the stresses to be exerted to the insulating films are decreased, the generation of cracks and peelings generated in the interfaces between the insulating films and in the insulating films due to the stresses generated at the ends of the interconnection structures can be effective prevented.

19 Claims, 5 Drawing Sheets

SEMICONDUCTOR DEVICE

CROSS-REFERENCE TO RELATED APPLICATIONS

This application is based upon and claims the benefit of priority from the prior Japanese Patent Application No. 2002-315609, filed in Oct. 30, 2002, the entire contents of which are incorporated herein by reference.

BACKGROUND OF THE INVENTION

The present invention relates to a semiconductor device comprising an inter-layer insulating film of low dielectric constant material.

In semiconductor device fabrication processes, a number of elements are formed on one semiconductor wafer, and the semiconductor wafer is cut along dicing lines into discrete LSI chips. On the side walls along the dicing lines, the interfaces of many inter-layer insulating films laid in the process of forming the elements are exposed. The interfaces are often paths for water intrusion, causing problems, such as erroneous operations and breakages, etc. of semiconductor devices, which impair their reliability. Stresses in the dicing, and stresses, etc. due to thermal expansion coefficient differences between the inter-layer insulating films and a sealing resin cause cracks in the inter-layer insulating films, and the cracks often are paths for water intrusion.

A structure bounding each LSI chip is provided inside the dicing lines along all the border, whereby the intrusion of water through the interfaces of the inter-layer insulating films and the extension of cracks in the inter-layer insulating films into the chip are prevented. Such structure is formed of layers of dummy patterns which are formed of the same layers as the interconnection layers forming the internal circuits and is often called a guard ring, a seal ring, a moisture resistant ring or others. Structures for preventing the water intrusion and cracks are described in, e.g., Japanese published unexamined patent application No. 2000-232081, Japanese published unexamined patent application No. 2000-232104, Japanese published unexamined patent application No. 2000-232105, Japanese published unexamined patent application No. 2000-277465, Japanese published unexamined patent application No. 2000-277713, Japanese published unexamined patent application No. 2001-053148, Japanese published unexamined patent application No. 2001-168093, and Japanese published unexamined patent application No. 2002-134506.

On the other hand, as semiconductor devices are larger scaled and more highly integrated, the design rules for the interconnection have been diminished as the generations have passed. Conventionally, the interconnection layers have been formed by depositing conducting materials and patterning the deposited conducting materials by lithography and dry etching, but as the generation passes, it has technical limits. As a new forming process which takes the place of the conventional interconnection layer forming process, the so-called damascene process, in which groove patterns and hole patterns are formed in inter-layer insulating films, and conducting materials are buried in the grooves and the holes, is increasingly used. The damascene process can form interconnection layers of low resistance materials, such as copper which is difficult for reactive etching, and is very effective to form low-resistance interconnection layers having micronized patterns.

As the interconnection layers are more micronized, the spacings of interconnections are smaller. Increase of the parasitic capacitance formed via the inter-layer insulating films is one factor for hindering speed-up of semiconductor devices. The use of organic insulating materials having lower dielectric constants (low-k materials) than the conventionally used silicon oxide film and silicon nitride film are studied. As the organic insulating materials, an organic-based polymer called "SiLK" (registered trademark) from The Dow Chemical Company, which is an organic SOG material, an organic-based polymer called "FLARE" (registered trade mark) from Honeywell Electronic Materials, etc. are known.

Low dielectric constant materials, such as the above-described organic insulating materials, etc. are largely different from the conventional materials having siloxane bonds, which are based on silicon oxide film in physical properties, such as Young's modulus, hardness and thermal expansion coefficient. Generally, to obtain low dielectric constant, structures, as of atoms or molecules, inside materials must be changed. The dielectric constant can be lowered as inter-atom distances or inter-molecule distances are larger, but increase of inter-atom distances or inter-molecule distances lead to lower bond strength. Accordingly, when a multi-level interconnection structure is formed of low dielectric constant materials, the adhesion in the interfaces with the inter-layer insulating films is lowered in comparison with the adhesion in the interfaces with the inter-layer insulating films of insulating materials based on the conventional silicon oxide film having siloxane bonds, and the mechanical strength of the inter-layer insulating films themselves is also lowered.

It has been found that in comparison with semiconductor devices using the conventional insulating materials, the semiconductor device including the inter-layer insulating film of low dielectric constant material have low mechanical strength and tend to have cracks and peelings in the inter-layer insulating film near structure, such as guard ring, etc., in which conductors are buried in relatively wide region, especially near acutely angled corners of patterns. When inter-layer insulating films mainly formed of different insulating materials are stacked, cracks and peelings tend to occur near the interface between the inter-layer insulating films.

The cracks which have occurred in the inter-layer insulating films do not impair device functions but extend in use of devices, resultantly often causing serious problems of the reliability. Accordingly, structures and the fabrication methods of the semiconductor devices using low dielectric constant materials, which can effectively prevent the cracks and peelings, are expected.

SUMMARY OF THE INVENTION

An object of the present invention is to provide a semiconductor device including an inter-layer insulating film of low dielectric constant material, which can effectively prevent the generation of cracks and peelings in the interface between the inter-layer insulating films and in the inter-layer insulating films.

According to one aspect of the present invention, there is provided a semiconductor device comprising: a first insulating film formed over a semiconductor substrate; a first interconnection structure buried in the first insulating film, and having a via portion buried in a groove-shaped via hole and an interconnection portion formed on the via portion and having an eave-shaped portion horizontally extended, a length of the eave-shaped portion of the interconnection portion being 3 times or more a height of the via portion; a second insulating film formed on the first insulating film with the first interconnection structure buried in, and formed of an insulating material whose thermal expansion coefficient is below 1/5 of a thermal expansion coefficient of an insulating material forming the first insulating film; and a second interconnection structure buried in the second insulating film and connected to the first interconnection structure.

According to another aspect of the present invention, there is provided a semiconductor device comprising: a first insulating film formed over a semiconductor substrate and formed mainly of a film of polyallyl ether resin; a first interconnection structure buried in the first insulating film, and having a via portion buried in a groove-shaped via hole and an interconnection portion formed on the via portion and having an eave-shaped portion horizontally extended; a second insulating film formed on the first insulating film with the first interconnection structure buried in, and formed mainly of a film of organosilicate glass; and a second interconnection structure buried in the second insulating film, and connected to the first interconnection structure.

According to further another aspect of the present invention, there is provided a semiconductor device comprising: a first insulating film formed over a semiconductor substrate; a first interconnection structure buried in at least a surface side of the first insulating film; a second insulating film formed on the first insulating film with the first interconnection structure buried in, and formed of an insulating material whose thermal expansion coefficient is 5 or more times a thermal expansion coefficient of an insulating film forming the first insulating film; and a second interconnection structure buried in the second insulating film, and having a via portion buried in a groove-shaped via hole and connected to the first interconnection structure and an interconnection portion formed on the via portion and having an eave-shaped portion horizontally extended, a length of the eave-shaped portion of the interconnection portion of the second interconnection structure being 3 times or more a height of the via portion.

According to further another aspect of the present invention, there is provided a semiconductor device comprising: a first insulating film formed over a semiconductor substrate, and formed mainly of a film of organosilicate glass; a first interconnection structure buried in at least a surface side of the first insulating film; a second insulating film formed on the first insulating film with the first interconnection structure buried in, and formed mainly of a film of polyallyl ether resin; and a second interconnection structure buried in the second insulating film, and having a via portion buried in a groove-shaped via hole and connected to the first interconnection structure and an interconnection portion formed on the via portion and having an eave-shaped portion horizontally extended.

According to the present embodiment, the guard ring comprises a first insulating film formed mainly of a film of polyallyl ether resin; a first interconnection structure buried in at least a surface side of the first insulating film; a second insulating film formed mainly of a film of organosilicate glass formed on the first insulating film with the first interconnection structure buried in; and a second interconnection structure buried in the second insulating film, and including a via portion buried in a groove-shaped via hole and connected to the first interconnection structure and an interconnection portion having eave-shaped ends horizontally extended beyond the via portion, whereby stresses to be exerted to the inter-layer insulating film can be effectively decreased, and the generation of cracks and peelings in the interface between the inter-layer insulating films or in the insulating film due to stresses generated at the end of the guard ring can be effectively prevented.

DETAILED DESCRIPTION OF THE INVENTION

Principle of the Invention

In regions where conductors are buried in relatively wide regions, such as guard ring, etc. provided at the boundary portion of semiconductor chips and boundary portions of fuse circuit regions, cracks and peelings tend to occur in the inter-layer insulating films. The generation of cracks and peelings is very influential when the inter-layer insulating films are formed of low dielectric constant material, such as organic insulating materials, etc., whose mechanical strength is low.

The inventors of the present application are the first to have made it clear that when adjacent inter-layer insulating films are formed of insulating materials whose thermal expansion coefficients are largely different from each other, increased stresses are exerted to the inter-layer insulating films, which increases cracks and peelings in the inter-layer insulating films.

Relationships between guard ring configurations and stresses exerted to the inter-layer insulating films will be explained with reference to the results of stress simulations.

In forming a guard ring of stacked ring patterns each including a via portion and an interconnection portion formed on the via portion, the structure that via portions are provided respectively on both ends of the interconnection portion, and the structure that a via portion is provided at the center of the interconnection portion may be considered.

First, the guard ring structure that via portions are provided on both ends of the interconnection portion will be explained.

Figure 1A:
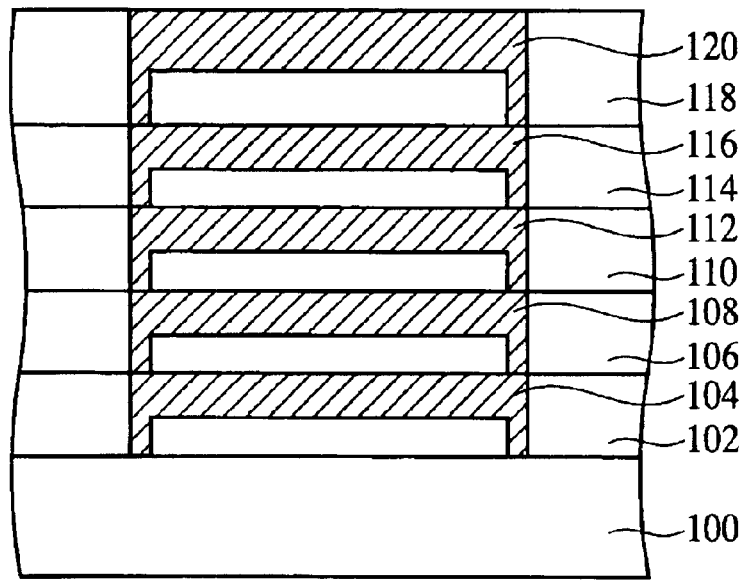
FIG. 1A is a sectional view of a semiconductor device used in a stress simulation, which shows a structure thereof (Part 1).
Figure 1B:
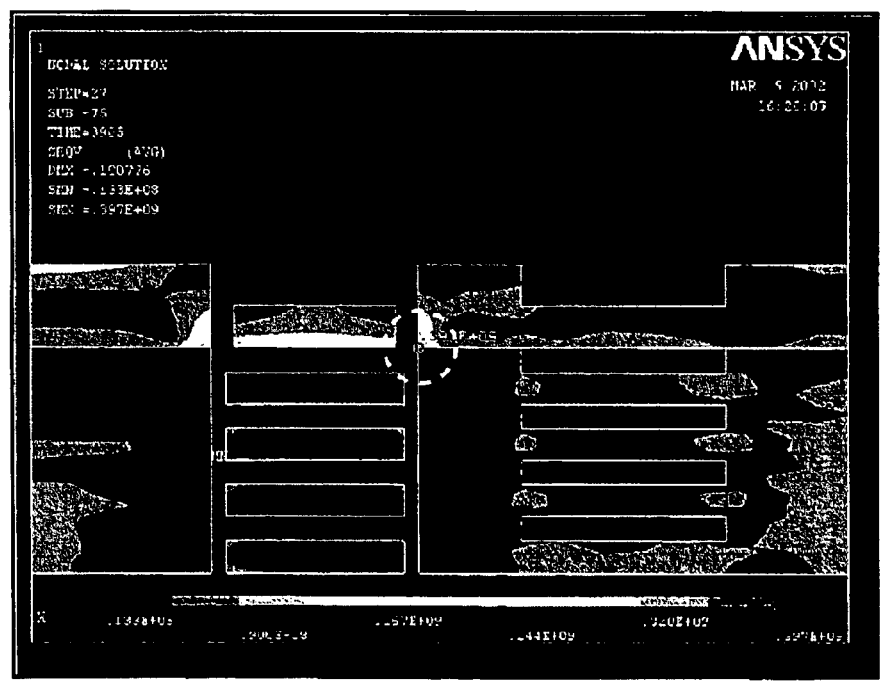
FIG. 1B is a view of the result of the stress simulation (Part 1).
Figure 2:
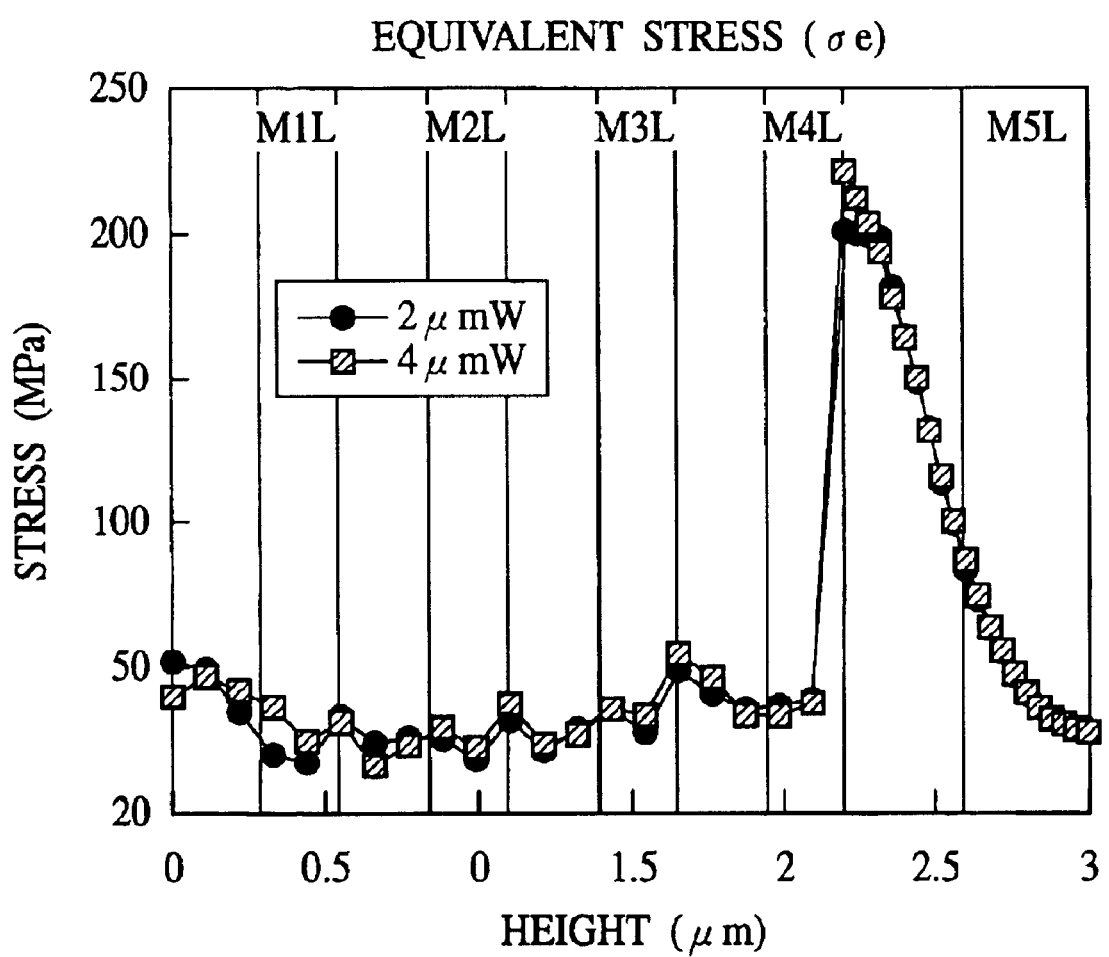
FIG. 2 is a graph of stress height-wise changes at the end of the guard ring of the semiconductor device.

FIG. 1A is a diagrammatic sectional view of the guard ring of the structure that via portions are provided respectively on both ends of each interconnection portion. FIG. 1B is a result of the stress simulation made on the structure of FIG. 1A. FIG. 2 is a graph of stresses at the end of the guard ring.

As shown in FIG. 1A, the structure of the guard ring used in the simulation includes 5 copper interconnection layers 104, 108, 112, 116, 120 laid one on another on a substrate 100. Inter-layer insulating films 102, 106, 110, 114 with the first to the fourth copper interconnection layers 104, 108, 112, 116 buried in are supposed to be the layer structure of SiC film/SiLK film/SiC film, respectively. Inter-layer insulating film 118 with the fifth copper interconnection layer 120 buried in is supposed to be the layer structure of SiOC film/SiC film/SiOC film/SiC film. In the structure used in the simulation, the widths of the via portions are 0.14 μm, and the widths of the interconnection portions are 2 μm. The specific structure of the inter-layer insulating films used in the simulation, such as film thicknesses of the respective layers, are the same as the structure of the embodiment which will be explained later.

FIG. 1B shows the result of the stress simulation made on the structure of FIG. 1A. The brighter regions indicate larger stresses. As shown in FIG. 1B, the position of the peak stress exerted to the inter-layer insulating films is the end of the guard ring (indicated by the dotted line in FIG. 1B) near the interface between the inter-layer insulating film 114 with the fourth copper interconnection layer 116 buried in and the inter-layer insulating film 118 with the fifth copper interconnection layer 120 buried in.

As shown in FIG. 2, the stress in the end of the guard ring are below about 50 MPa up to the fourth copper interconnection layer M4L but above about 200 MPa near the interface between the fourth copper interconnection layer M4L and the fifth copper interconnection layer M5L, which is increased by above 4 times. As shown in FIG. 2, for the interconnection portion width of 4 μm, the stress values were substantially the same.

The abrupt stress increase between the fourth copper interconnection layer and the fifth copper interconnection layer will be due to the change of the materials of the inter-layer insulating film. The first to the fourth copper interconnection layers are buried in the inter-layer insulating films formed mainly of SiLK film, and the fifth copper interconnection layer is buried in the inter-layer insulating film formed mainly of SiOC film. The organic insulating materials of polyallyl ether resins, such as SiLK, FLARE, etc., have very large thermal expansion coefficients. The thermal expansion coefficient of SiLK is about 60 ppm/K. In contrast to this, the thermal expansion coefficients of the insulating materials of organosilicate glass are blow about ⅕ of those of the insulating materials of polyallyl ether resins. The thermal expansion coefficients of SiOC and $SiO_2$ are about 12 ppm/K and about 0.6 ppm/K. Accordingly, stresses due to thermal expansion coefficient differences will be concentrated near the interface of the inter-layer insulating film formed mainly of SiLK film and the inter-layer insulating film formed mainly of SiOC film.

Then, the guard ring structure that a via portion is provided at the center of the interconnection portion will be explained.

Figure 3A:
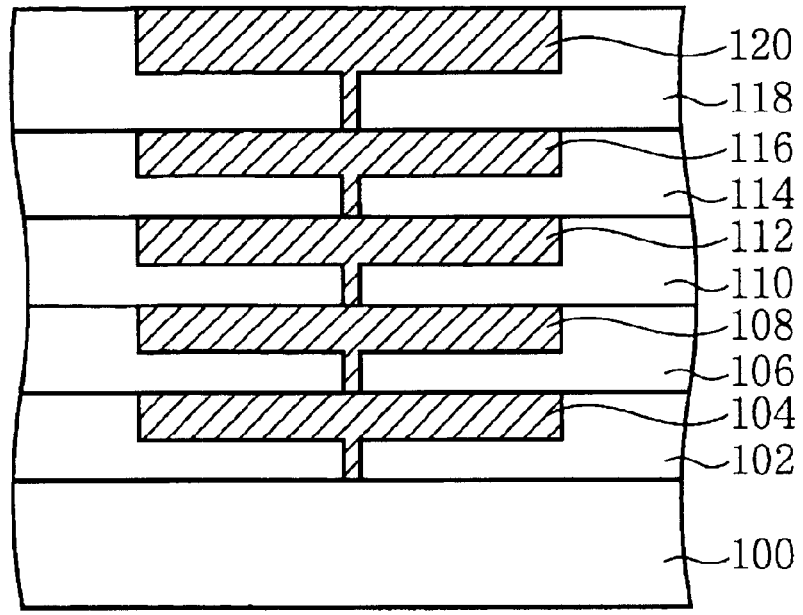
FIG. 3A is a sectional view of a semiconductor device used in a stress simulation, which shows a structure thereof (Part 2).
Figure 3B:
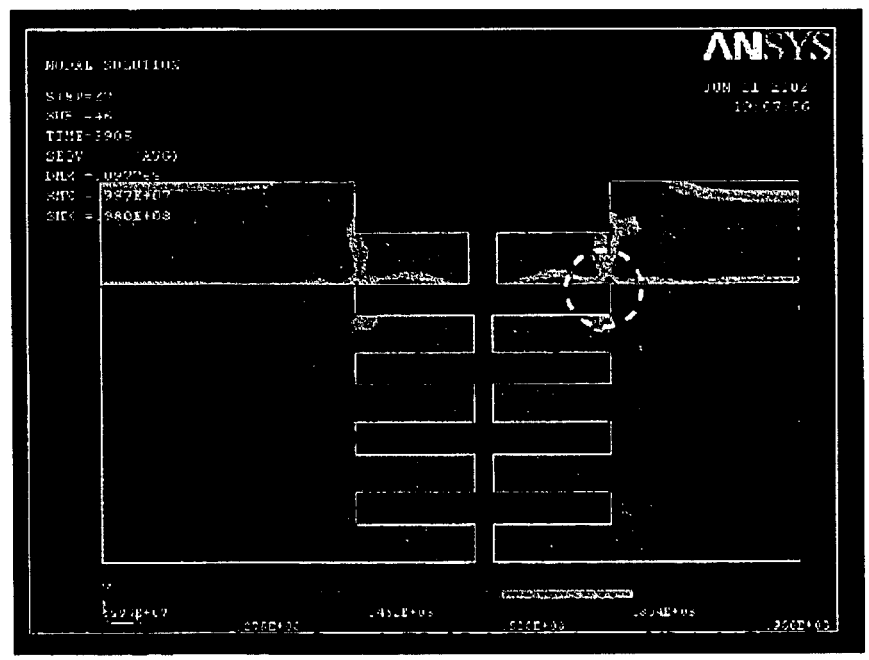
FIG. 3B is a view of the result of the stress simulation (Part 2).
Figure 4A:
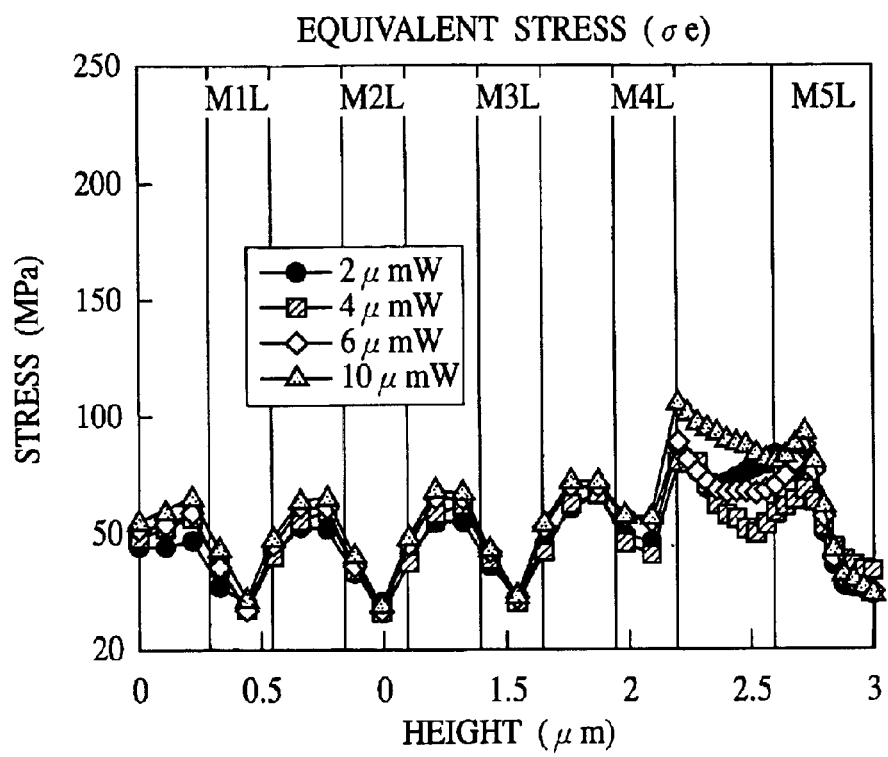
FIGS. 4A and 4B are graphs of stress height-wise changes at the end of the guard ring of the semiconductor device.
Figure 4B:
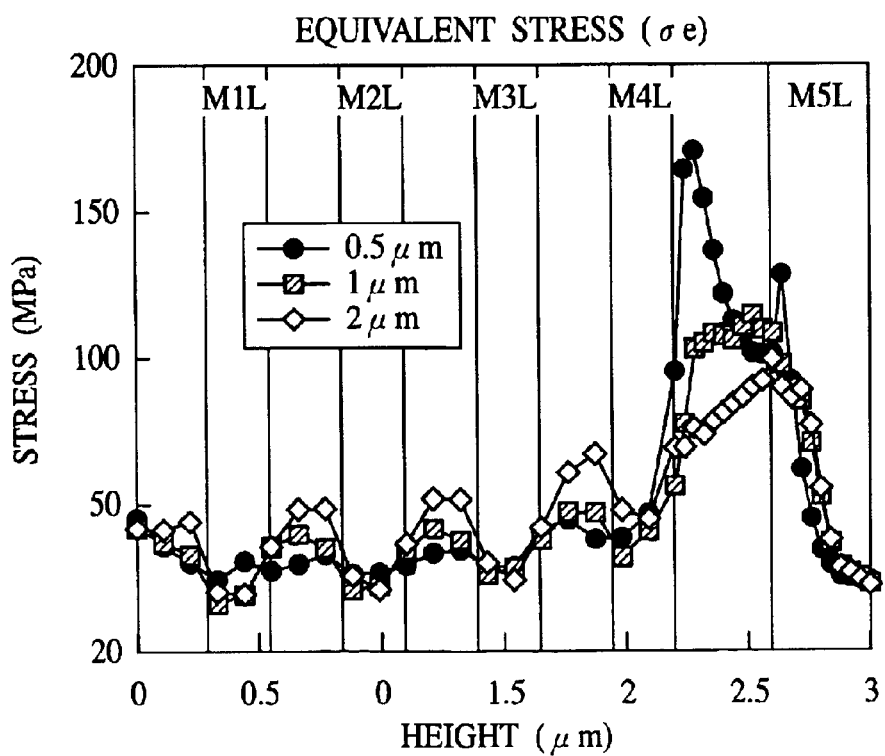

FIG. 3A is a diagrammatic sectional view of the structure of the guard ring that the via portion is provided at the center of the interconnection portion. FIG. 3B is a result of the stress simulation made on the structure of FIG. 3A. FIGS. 4A and 4B are graphs of peak values of the stresses exerted in FIG. 3B.

As shown in FIG. 3A, the structure of the guard ring used in the simulation includes 5 copper interconnection layers 104, 108, 112, 116, 120 laid one on another on a substrate 100. Inter-layer insulating films 102, 106, 110, 112 with the first to the fourth copper interconnection layers 104, 108, 112, 116 buried in are supposed to be the layer structure of SiC film/SiLK film/SiC film. Inter-layer insulating film 118 with the fifth copper interconnection layer 120 buried in is supposed to be the layer structure of SiOC film/SiC film/ SiOC film/SiC film. In the structure used in the simulation, the widths of the via portions are 0.14 μm, and the widths of the interconnection portions are 2 μm. The specific structure of the inter-layer insulating films, e.g., film thicknesses of the respective layers, used in the simulation is the same as that of the embodiment which will be described later.

As shown in FIG. 3B, the position of the peak stress exerted to the inter-layer insulating films is the end of the guard ring (indicated by the dotted line in FIG. 3B) near the interface between the inter-layer insulating film 114 with the fourth copper interconnection layer 116 buried in and the inter-layer insulating film 118 with the fifth copper interconnection layer 120 buried in. This is quite the same as in the guard ring shown in FIG. 1A.

However, the stress at this region is about 100 MPa at highest, which can be suppressed to be below a half of the stress exerted in the guard ring of the structure shown in FIG. 1A. As shown in FIG. 4A, for the interconnection portions whose widths are above 2 μm, the stress values were substantially the same. On the other hand, as the widths of the interconnection portions were decreased to be below 2 μm, as shown in FIG. 4B, the stress values were gradually increased to be 150 MPa for the width of 0.5 μm.

As described above, when the inter-layer insulating film of polyallyl ether resin and the inter-layer insulating film of organosilicate glass are provided adjacent to each other, in order to decrease the stress to be exerted to the inter-layer insulating films, preferably, the guard ring has the structure that at least the interconnection layer buried in the inter-layer insulating film of polyallyl ether resin has the ends spaced from the ends of the via portion. The structure of the guard ring that the ends of the interconnection layer are spaced from the ends of the via portion may be provided in the inter-layer insulating film of a higher thermal expansion coefficient, and the guard ring of the same configuration may not be essentially provided in the interconnection layers buried in the inter-layer insulating films of organosilicate glass.

When the inter-layer insulating film of polyallyl ether resin and the inter-layer insulating film of organosilicate glass are stacked in the order opposite to the order described above, the guard ring of the structure that the ends of the interconnection layer are spaced from the ends of the via portion is used in the interconnection layer buried in the inter-layer insulating film of pollyallyl ether resin, whereby stresses to be exerted to the inter-layer insulating films can be decreased.

The inventors of the present application have made studies and found that when the inter-layer insulating films of polyallyl ether resin and the inter-layer insulating film of organosilicate glass are provided adjacent to each other, the ratio of the height of the via portion and the length of the eave-shaped portion of the interconnection portion side-wise projected beyond the via potion is above 3 times, i.e., the ratio of the length of the eave-shaped portion of the interconnection portion to the height of the via portion is set to be above 3 times, whereby the stress exerted to the inter-layer insulating films can be effectively decreased.

However, the stress to be exerted to the inter-layer insulating films varies depending on materials, structures and film thicknesses of the inter-layer insulating films, configurations of the guard rings, etc. the fracture strength of the inter-layer insulating film varies depending on materials, structures, film thicknesses, etc. of the inter-layer insulating films. Accordingly, it is difficult to specify the configuration of the guard rings. It is preferable to suitably set the parameters for defining configurations of the guard rings so that stresses exerted to the ends of the guard ring can be below the fracture strengths of the interfaces between the inter-layer insulating films or the inter-layer insulating films themselves.

A First Embodiment

The semiconductor device according to one embodiment of the present invention will be explained with reference to FIG. 5.

Figure 5:
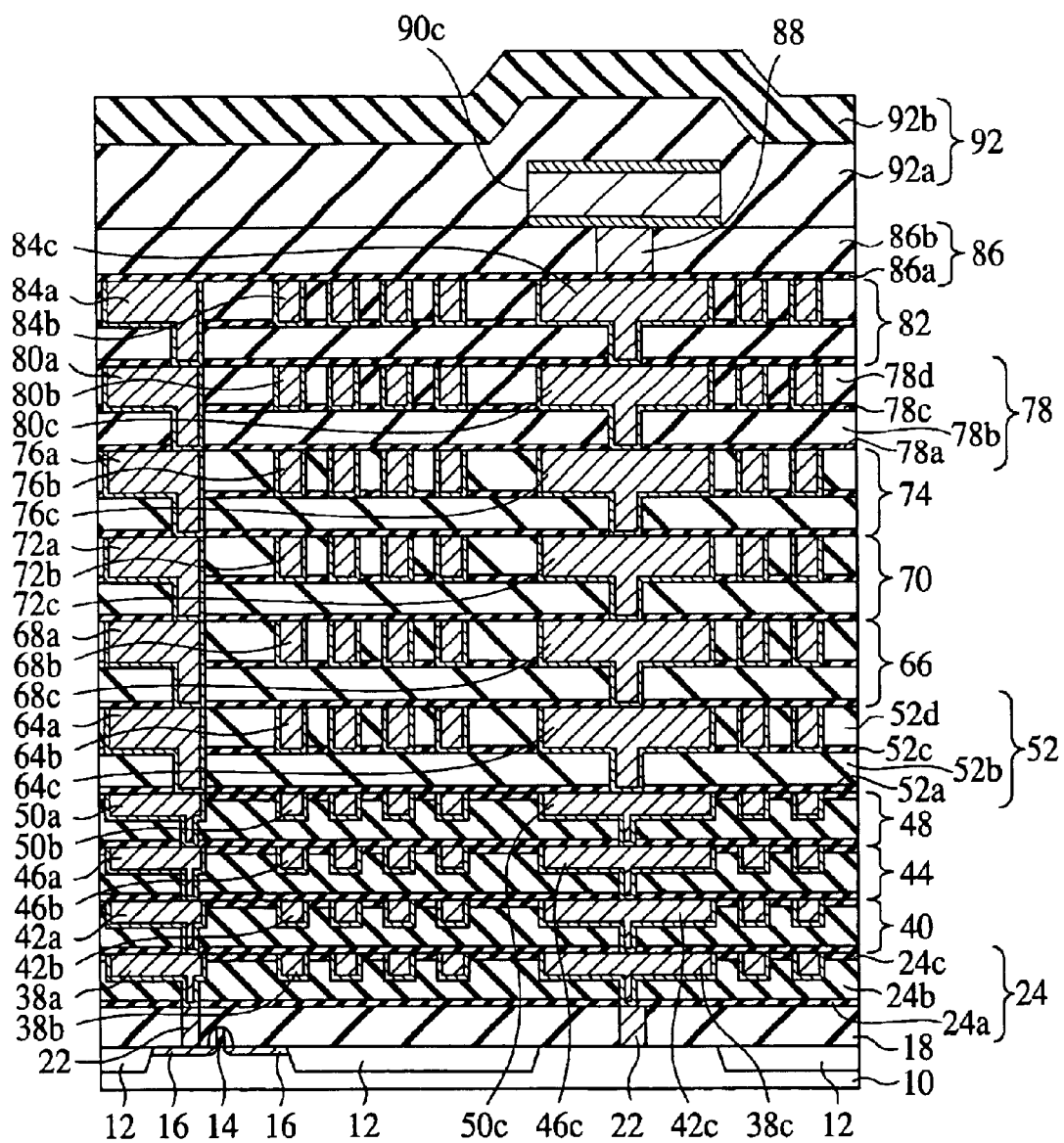
FIG. 5 is a diagrammatic sectional view of the semiconductor device according to one embodiment of the present invention, which shows a structure thereof.

FIG. 5 is a diagrammatic sectional view of the semiconductor device according to the present embodiment, which shows a structure thereof.

A device isolation film 12 is formed on a silicon substrate 10. MOS transistors each including a gate electrode 14 and source/drain diffused layers 16 are formed on the silicon substrate 10 with the device isolation film 12 formed on. An inter-layer insulating film 18 of silicon oxide, which is, e.g., undoped or doped with P (phosphorus) or B (boron), is formed on the silicon substrate 10 with the MOS transistors formed on. Contact plugs 22 of, e.g., barrier metal and W (tungsten) are buried in the inter-layer insulating film 18.

An inter-layer insulating film 24 of the layer structure of, e.g., a 30 nm-thick SiC film 24a, a 450 nm-thick SILK film 24b and a 50 nm-thick SiC film is formed on the inter-layer insulating film 18. The SiC film 24a is a film for preventing the diffusion of Cu, and the SiC film 24c is a film for the hard mask.

Interconnection grooves and via holes are formed in the inter-layer insulating film 24. An interconnection layer 38a is formed in the internal circuit regions, dummy patterns 38b are formed in the dummy pattern region, and a ring pattern 38c is buried in the guard ring region. The interconnection layer 38a, the dummy patterns 38b and the ring pattern 38c are formed of the same conducting layer formed of a barrier metal layer and a Cu layer. The ring pattern 38c has a 0.14 $\mu$m-width via portion and a 2 $\mu$m-width interconnection portion. The height of the via portion is 0.3 $\mu$m, and the length of the eave-shaped portion of the interconnection portion is 1 $\mu$m. The ratio of the length of the eave-shaped portion of the interconnection portion to the height of the via portion (the length of the eave-shaped portion/the height of the via portion) is about 3.3.

On the inter-layer insulating film 24, inter-layer insulating films 40, 44, 48 of the same layer structure as the inter-layer insulating film 24 are formed. As in the inter-layer insulating film 24, an interconnection layer 42a, dummy patterns 42b and a ring pattern 42c are buried in the inter-layer insulating film 40. As in the inter-layer insulating film 24, an interconnection layer 46a, dummy patterns 46b and a ring pattern 46c are buried in the inter-layer insulating film 44. As in the inter-layer insulating film 24, an interconnection layer 50a, dummy patterns 50b and a ring pattern 50c are buried in the inter-layer insulating film 48. The ring patterns 42c, 46b, 46c, 50c have the same pattern size as the ring pattern 38c.

An inter-layer insulating film 52 of the layer structure of, e.g., a 70 nm-thick SiC film 52a, a 350 nm-thick SiOC film 52b, a 30 nm-thick SiC film 52c and a 370 nm-thick SiOC film 52d is formed on the inter-layer insulating film 48. The SiC film 52a is a film for preventing the diffusion of Cu, and the SiC film 52c is a film for the etching stopper.

As in the inter-layer insulating film 24, an interconnection layer 64a, dummy patterns 64b and a ring pattern 64c are buried in the inter-layer insulating film 52. The interconnection layer 64a, the dummy patterns 64b and the ring pattern 64c are formed of the same conducting layer formed of a barrier metal layer and a Cu layer. The ring pattern 64c has a 0.22 $\mu$m-width via portion and a 2 $\mu$m-width interconnection portion. The height of the via portion is 0.4 $\mu$m, and the length of the eave-shaped portion of the interconnection portion is 1 $\mu$m. The ratio of the length of the eave-shaped portion of the interconnection portion to the height of the via portion (the length of the eave-shaped portion/the height of the via portion) is about 2.5.

Inter-layer insulating films 66, 70, 74 of the same layer structure as the inter-layer insulating film 52 are formed on the inter-layer insulating film 52. As in the inter-layer insulating film 24, an interconnection layer 68a, dummy patterns 68b and a ring pattern 68c are buried in the inter-layer insulating film 66. As in the inter-layer insulating film 24, an interconnection layer 72a, dummy patterns 72b and a ring pattern 72c are buried in the inter-layer insulating film 70. As in the inter-layer insulating film 24, an interconnection layer 76a, dummy patterns 76b and a ring pattern 76c are buried in the inter-layer insulating film 74. The ring patterns 68c, 72c, 76c have the pattern size of a 0.28 $\mu$m-via portion width and a 2 $\mu$m-width interconnection portion. The height of the via portion is 0.4 $\mu$m, and the length of the eave-shaped portion of the interconnection portion is 1 $\mu$m, and a ratio of the length of the eave-shaped portion of the interconnection portion to the height of the via portion (length of the eave-shaped portion/height of the via portion) is about 2.5.

An inter-layer insulating film 78 of the layer structure of, e.g., a 70 nm-thick SiC film 78a, a 530 nm-thick $SiO_2$ film 78, a 30 nm-thick SiC film 78c and a 870 nm-thick $SiO_2$ film 78d is formed on the inter-layer insulating film 74. The SiC film 78a is a film for preventing the diffusion of Cu, and the SiC film 78c is a film for the etching stopper.

As in the inter-layer insulating film 24, an interconnection layer 80a, dummy patterns 80b and a ring pattern 80c are buried in the inter-layer insulating film 78. The inter-connection layer 80a, the dummy patterns 80b and the ring pattern 80c are formed of the same conducting layer formed of a barrier metal layer and a Cu layer. An inter-layer insulating film 82 of the same layer structure as the inter-layer insulating film 78 is formed on the inter-layer insulating film 78. As in the inter-layer insulating film 24, an inter-connection layer 84a, dummy patterns 84b and a ring pattern 84c are buried in the inter-layer insulating film 82. The ring patterns 80c, 84c have the pattern size of a 0.42 $\mu$m-width via portion and a 2 $\mu$m-width interconnection portion. The height of the via portion is 0.6 $\mu$m, and the length of the eave-shaped portion of the interconnection portion is 1 $\mu$m, and a ratio of the length of the eave-shaped portion of the interconnection portion to the height of the via portion (length of the eave-shaped portion/height of the via portion) is about 1.7.

An inter-layer insulating film 86 of the layer structure of, e.g., a 70 nm-thick SiC film 86a and a 430 nm-thick $SiO_2$ film 86b is formed on the inter-layer insulating film 82. A contact plug 88 of, e.g., a barrier metal and W is buried in the inter-layer insulating film 86. A ring pattern 90c of TiN/Al/TiN structure is formed on the inter-layer insulating film 86 connected to the contact plug 86. A cover film 92 of the layer structure of a 900 nm-thick $SiO_2$ film 92a and a 500 nm-thick SiN film 92b is formed on the inter-layer insulating film 86 with the ring pattern 90c formed on.

In the semiconductor device according to the present embodiment, the guard ring is formed of the layer structure of the contact plug 22, the ring patterns 38c, 42c, 46c, 50c, 64c, 68c, 72c, 76c, 80c, 84c, the contact plug 88 and the ring pattern 90 interconnected in thickness-wise.

Here, one of the ring patterns forming the guard ring, which is buried in the inter-layer insulating film, whose thermal expansion coefficient is higher by about 5 times than the inter-layer insulating films they are adjacent to has the via portion buried in the groove-shaped via hole and the interconnection portion horizontally extended beyond the sides of the via portion, and the ratio of the length of the eave-shaped portion of the interconnection portion to the height of the via portion (the length of the eave-shaped portion/the height of the via portion) is above 3, whereby the stresses to be exerted to the inter-layer insulating films can be effectively decreased. Accordingly, the generation of cracks and peelings in the interface between the inter-layer insulating films and in the inter-layer insulating films due to stresses generated at the ends of the guard ring can be effectively prevented.

As described above, according to the present invention, stresses to be exerted to the inter-layer insulating films can be effectively decreased, and the generation of cracks and peelings generated in the interfaces between the inter-layer insulating films and in the inter-layer insulating films due to stresses generated in the guard ring end can be effectively prevented.

Modified Embodiments

The present invention is not limited to the above-described embodiment and can cover other various modifications.

In the above-described embodiment, the insulating material of polyallyl ether resin is SILK, and the insulating material of organosilicate glass is SiOC. However, the combination of the insulating materials is not limited to the above. Organic insulating materials, such as FLARE, etc., may be used as polyallyl ether resins, and $SiO_2$ may be used as organosilicate glass.

In the above-described embodiment, SiC film is used as the film for the prevention of the diffusion of Cu and as the etching stopper, but other films, such as SiN film, etc., may be used.

In the above-described embodiment, the inter-layer insulating film formed mainly of polyallyl ether resin, and the inter-layer insulating film formed mainly of organosilicate glass are adjacent to each other. The guard ring structure of the present invention is applicable also to the case that inter-layer insulating films having the same thermal expansion coefficient difference as that between the above-described inter-layer insulating films, i.e., the thermal expansion coefficient of one inter-layer insulating film is below about ⅕ of that of the other inter-layer insulating film.

In the above-described embodiment, one guard ring is provided, but 2 or more guard rings may be provided adjacent to each other. According to the studies made by the inventors of the present application, the stress exerted to the inter-layer insulating films with a plurality of the guard rings provided is substantially the same as the stress exerted to the inter-layer insulating films with one guard ring provided. Thus, even with 2 or more guard rings provided, the structure of the present invention may be used to thereby effective decrease the stress to be exerted to the inter-layer insulating films.

In the above-described embodiment, the present invention is applied to the guard ring. The structure of the present invention is applicable to not limited to the guard ring. In spiral inductors, the same layer structure as that of the guard ring is often used, and in such case, the present invention is used to thereby prevent cracks and peelings in the inter-layer insulating films around the inductors. The guard ring is not only for enclosing chips, but also for enclosing, e.g., fuse circuit regions.

What is claimed is:

1. A semiconductor device comprising:
   a first insulating film formed over a semiconductor substrate;
   a first interconnection structure buried in the first insulating film, and having a via portion buried in a groove-shaped via hole and an interconnection portion formed on the via portion and having an eave-shaped portion horizontally extended, a length of the eave-shaped portion of the interconnection portion being 3 times or more a height of the via portion;
   a second insulating film formed on the first insulating film with the first interconnection structure buried in, and formed of an insulating material whose thermal expansion coefficient is below ⅕ of a thermal expansion coefficient of an insulating material forming the first insulating film; and
   a second interconnection structure buried in the second insulating film and connected to the first interconnection structure.

2. A semiconductor device comprising:
   a first insulating film formed over a semiconductor substrate and formed mainly of a film of polyallyl ether resin;
   a first interconnection structure buried in the first insulating film, and having a via portion buried in a groove-shaped via hole and an interconnection portion formed on the via portion and having an eave-shaped portion horizontally extended;
   a second insulating film formed on the first insulating film with the first interconnection structure buried in, and formed mainly of a film of organosilicate glass; and
   a second interconnection structure buried in the second insulating film, and connected to the first interconnection structure.

3. A semiconductor device according to claim 2, wherein a length of the eave-shaped portion of the interconnection portion of the first interconnection structure is 3 times or more a height of the via portion.

4. A semiconductor device according to claim 1, wherein the via portion and the interconnection portion of the first interconnection structure are formed of the same conducting layer.

5. A semiconductor device according to claim 2, wherein the via portion and the interconnection portion of the first interconnection structure are formed of the same conducting layer.

6. A semiconductor device according to claim 1, wherein the first interconnection structure and the second interconnection structure form at least a part of a guard ring.

7. A semiconductor device according to claim 2, wherein the first interconnection structure and the second interconnection structure form at least a part of a guard ring.

8. A semiconductor device according to claim 1, wherein the first interconnection structure and the second interconnection structure are formed of a conducting material mainly formed of copper.

9. A semiconductor device according to claim 2, wherein the first interconnection structure and the second interconnection structure are formed of a conducting material mainly formed of copper.

10. A semiconductor device according to claim 1, wherein the first insulating film is a layer structure of a film of polyallyl ether resin, and a film which functions to prevent the diffusion of copper and/or functions as an etching stopper for the film of polyallyl ether resin.

11. A semiconductor device according to claim 1, wherein the second insulating film is a layer structure of a film of organosilicate glass, and a film which functions to prevent the diffusion of copper and/or functions as an etching stopper for the film of organosilicate glass.

12. A semiconductor device comprising:

a first insulating film formed over a semiconductor substrate;

a first interconnection structure buried in at least a surface side of the first insulating film;

a second insulating film formed on the first insulating film with the first interconnection structure buried in, and formed of an insulating material whose thermal expansion coefficient is 5 or more times a thermal expansion coefficient of an insulating film forming the first insulating film; and a second interconnection structure buried in the second insulating film, and having a via portion buried in a groove-shaped via hole and connected to the first interconnection structure and an interconnection portion formed on the via portion and having an eave-shaped portion horizontally extended, a length of the eave-shaped portion of the interconnection portion of the second interconnection structure being 3 times or more a height of the via portion.

13. A semiconductor device comprising:

a first insulating film formed over a semiconductor substrate, and formed mainly of a film of organosilicate glass;

a first interconnection structure buried in at least a surface side of the first insulating film;

a second insulating film formed on the first insulating film with the first interconnection structure buried in, and formed mainly of a film of polyallyl ether resin; and a second interconnection structure buried in the second insulating film, and having a via portion buried in a groove-shaped via hole and connected to the first interconnection structure and an interconnection portion formed on the via portion and having an eave-shaped portion horizontally extended.

14. A semiconductor device according to claim 2, wherein the film of polyallyl ether resin is SiLK film or FLARE film.

15. A semiconductor device according to claim 13, wherein
the film of polyallyl ether resin is SiLK film or FLARE film.

16. A semiconductor device according to claim 2, wherein the film of orgnaosilicate glass is SiOC film or $SiO_2$ film.

17. A semiconductor device according to claim 13, wherein
the film of orgnaosilicate glass is SiOC film or $SiO_2$ film.

18. A semiconductor device according to claim 10, wherein
the film which functions to prevent the diffusion of copper and/or functions as an etching stopper for the film of polyallyl ether resin is SiC film or SiN film.

19. A semiconductor device according to claim 11, wherein
the film which functions to prevent the diffusion of copper and/or functions as an etching stopper for the film of organosilicate glass is SiC film or SiN film.

* * * * *